(12) United States Patent
Duong et al.

(10) Patent No.: US 9,664,731 B2
(45) Date of Patent: May 30, 2017

(54) DUAL RF TEST CONNECTION IN PORTABLE DEVICE

(71) Applicant: Motorola Mobility LLC, Chicago, IL (US)

(72) Inventors: Minh H Duong, Lake Bluff, IL (US); Joseph L Allore, Mundelein, IL (US); Michael J Lombardi, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 198 days.

(21) Appl. No.: 14/609,478

(22) Filed: Jan. 30, 2015

(65) Prior Publication Data
US 2016/0223589 A1 Aug. 4, 2016

(51) Int. Cl.
*G01R 31/00* (2006.01)
*G01R 31/28* (2006.01)
*H05K 5/00* (2006.01)

(52) U.S. Cl.
CPC ....... *G01R 31/2884* (2013.01); *H05K 5/0069* (2013.01)

(58) Field of Classification Search
CPC .......... G01R 1/04; G01R 1/18; G01R 31/002; G01R 31/2886; G01R 31/2889; H04M 1/677; H04M 1/6775; H04M 1/2535; H05K 5/00; H05K 5/04; H05K 5/0034; H05K 5/0069; H05K 5/0086
See application file for complete search history.

(56) References Cited

U.S. PATENT DOCUMENTS

2008/0297421 A1* 12/2008 Kriebel .............. G06K 19/0716
343/702
2009/0275364 A1* 11/2009 Morel ................ G06K 7/10297
455/558

* cited by examiner

*Primary Examiner* — Minh N Tang
(74) *Attorney, Agent, or Firm* — Miller, Matthias & Hull LLP (57) ABSTRACT

A system and method of circuit board and device construction provide an RF testing connection for thin devices that lack space between their printed circuit board (PCB) and their housing for a test connection. In particular, in designs wherein the device PCB lies against the rear housing of the device, the use of a dedicated test connector on the back of the main PCB is problematic, but a circuit configuration is provided such that a removable test connection can be used without affecting the operation of the device or the configuration of the PCB itself.

20 Claims, 7 Drawing Sheets

DUAL RF TEST CONNECTION IN PORTABLE DEVICE

TECHNICAL FIELD

The present disclosure is related generally to mobile device configuration, and, more particularly, to a test connection system and method for a portable cellular device.

BACKGROUND

Cellular device manufacturers must test device prototypes, including the housing and other components and particularly the printed circuit board (PCB), before releasing the device for production. A device whose prototype has been tested and approved may be manufactured and sold commercially as long as it remains essentially identical to the prototype.

In addition, access to the device PCB during manufacture is also often required. For example, there may be a need, during manufacture of a device, to program certain integrated circuits on the device PCB, so a port or connector must exist on the PCB for this function.

On modern cellular device designs, these testing and programming needs are met by configuring the PCB to provide, on its back surface, a dedicated connector that can be used for both programming and testing. With respect to units meant as test units, an access hole is machined into the back of the device's housing, such that access to the test connector from outside the device is possible even with a fully assembled device. These test connectors and access holes are then also used by third party testing facilities to validate that devices meet government or carrier regulations. The access holes are eliminated on final production units, but the dual purpose test connector itself must remain for RF programming to occur during the production process.

The problem with this existing design approach lies with the fact that the access to the dual purpose test connector is through the back of the device. That is, since access through the front of the device is not practical due to the display or touchscreen of the device, the access hole must be on the back of the device.

This causes a problem for compact product designs wherein the PCB lies directly against the inside surface of the rear of the housing. In such a configuration, there is no remaining space within the device for a traditional test connector to reside on the back side of the main PCB. As such, a different approach to enabling the testing and programming of a mobile device PCB is considered by the inventors to be beneficial.

While the present disclosure is directed to a system that can eliminate some of the shortcomings noted in this Background section, it should be appreciated that any such benefit is not a limitation on the scope of the disclosed principles, nor of the attached claims, except to the extent expressly noted in the claims. Additionally, the discussion of technology in this Background section is reflective of the inventors' own observations, considerations, and thoughts, and is in no way intended to accurately catalog or comprehensively summarize the prior art. As such, the inventors expressly disclaim this section as admitted or assumed prior art with respect to the discussed details. Moreover, the identification herein of a desirable course of action reflects the inventors' own observations and ideas, and should not be assumed to indicate an art-recognized desirability.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Before presenting a detailed discussion of embodiments of the disclosed principles, an overview of certain embodiments is given to aid the reader in understanding the later discussion. As noted above, the traditional method of RF programming and testing of portable electronic devices is less desirable as device dimensions shrink. In particular, in designs wherein the device PCB back lies against the rear housing of the device, the use of a dedicated test connector on the back of the main PCB is problematic.

In an embodiment, a portable device is provided having a main PCB, on a first side of which nearly all components, including at least a processor and a memory chip or circuit, are affixed. The PCB is located within the device and adjacent to a rear housing of the device, such that first side of the PCB is facing away from the rear housing and an opposite side of the PCB is positioned directly adjacent said housing.

To facilitate RF (radio frequency) programming, an RF test connector is placed on the first side of the PCB. Similarly, to facilitate RF testing, a second RF test connector is placed on the second side of the PCB. This configuration allows the RF test connector on the second side of the PCB to protrude through the rear housing for access to the connection in a fully assembled device. This test connector may be removed in production devices and the hole in the rear housing removed.

Solder or connection pads for a zero ohm resistor or shorting component are located in parallel with but on the opposite side of the PCB from the pads for the second RF test connector. The zero ohm resistor is installed on the first side of the PCB only when the RF test connector on the second side of the PCB is omitted. Thus, for RF programming purposes using the exact same PCB in a production scenario, the RF test connector on the first side of the PCB is installed and the zero ohm resistor on the first side is also installed. However, the RF test connector on the second side of the PCB is not installed in the production configuration, and thus, no RF components are present on the second side of the PCB during production. This ability to vary the placing and availability of test and programming connectors without modifying the PCB itself allows for a compact device design where there is no space in the production version to allow a test connector on the back of the PCB.

With this overview in mind, and turning now to a more detailed discussion in conjunction with the attached figures, the techniques of the present disclosure are illustrated as being implemented in a suitable computing environment. The following device description is based on embodiments and examples of the disclosed principles and should not be taken as limiting the claims with regard to alternative embodiments that are not explicitly described herein. Thus, for example, while FIG. 1 illustrates an example mobile device within which embodiments of the disclosed principles may be implemented, it will be appreciated that other device types may be used, including but not limited to personal computers, tablet computers and other devices.

Figure 1:
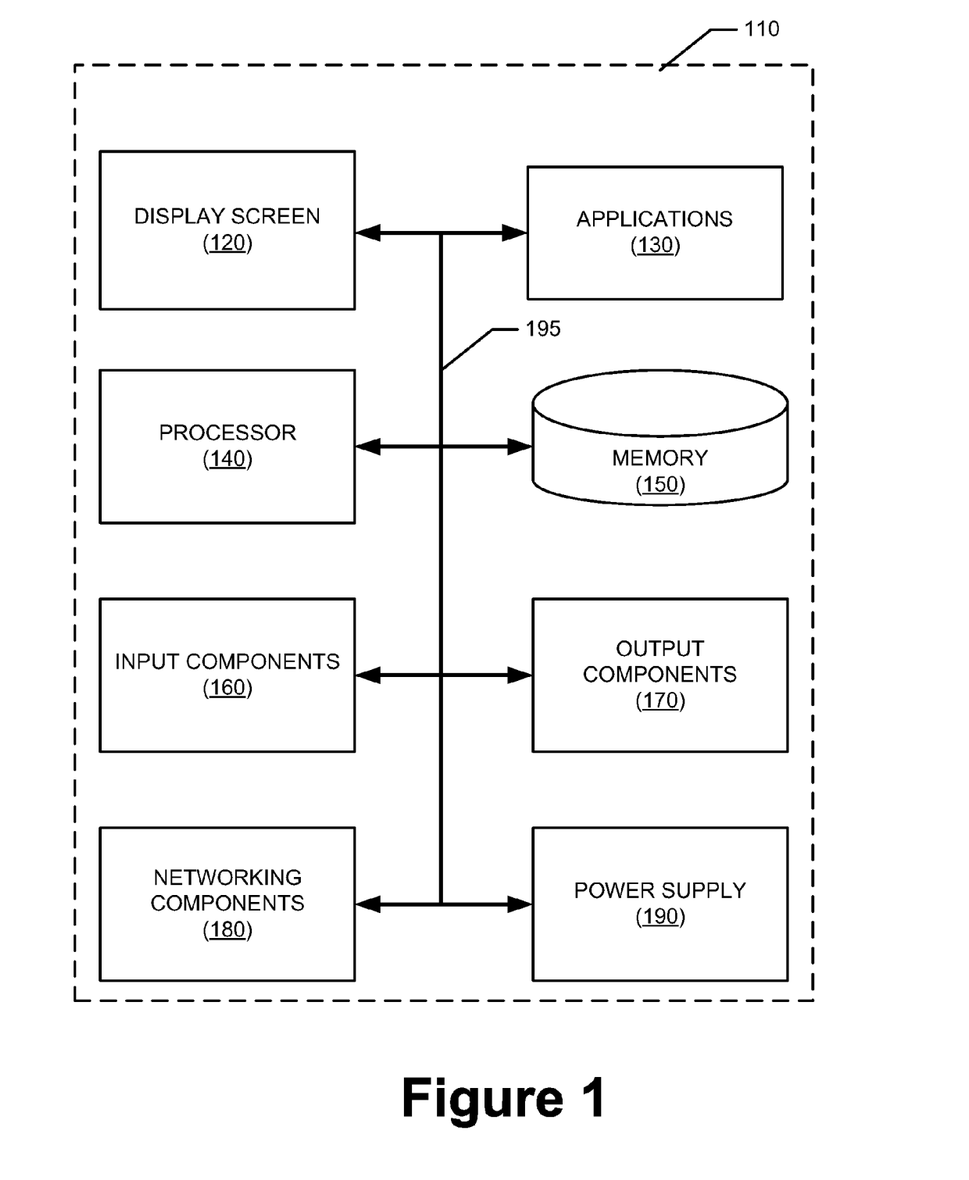
FIG. 1 is a simplified schematic of an example device with respect to which embodiments of the presently disclosed principles may be implemented.

The schematic diagram of FIG. 1 shows an exemplary device 110 forming part of an environment within which aspects of the present disclosure may be implemented. In particular, the schematic diagram illustrates a user device 110 including several exemplary components. It will be appreciated that additional or alternative components may be used in a given implementation depending upon user preference, component availability, price point, and other considerations.

In the illustrated embodiment, the components of the user device 110 include a display screen 120, applications (e.g., programs) 130, a processor 140, a memory 150, one or more input components 160 such as speech and text input facilities, and one or more output components 170 such as text and audible output facilities, e.g., one or more speakers.

The processor 140 can be any of a microprocessor, microcomputer, application-specific integrated circuit, or the like. For example, the processor 140 can be implemented by one or more microprocessors or controllers from any desired family or manufacturer. Similarly, the memory 150 may reside on the same integrated circuit as the processor 140. Additionally or alternatively, the memory 150 may be accessed via a network, e.g., via cloud-based storage. The memory 150 may include a random access memory (i.e., Synchronous Dynamic Random Access Memory (SDRAM), Dynamic Random Access Memory (DRAM), RAMBUS Dynamic Random Access Memory (RDRM) or any other type of random access memory device). Additionally or alternatively, the memory 150 may include a read only memory (i.e., a hard drive, flash memory or any other desired type of memory device).

The information that is stored by the memory 150 can include program code associated with one or more operating systems or applications as well as informational data, e.g., program parameters, process data, etc. The operating system and applications are typically implemented via executable instructions stored in a non-transitory computer readable medium (e.g., memory 150) to control basic functions of the electronic device 110. Such functions may include, for example, interaction among various internal components and storage and retrieval of applications and data to and from the memory 150.

Further with respect to the applications, these typically utilize the operating system to provide more specific functionality, such as file system service and handling of protected and unprotected data stored in the memory 150. Although many applications may provide standard or required functionality of the user device 110, in other cases applications provide optional or specialized functionality, and may be supplied by third party vendors or the device manufacturer.

Finally, with respect to informational data, e.g., program parameters and process data, this non-executable information can be referenced, manipulated, or written by the operating system or an application. Such informational data can include, for example, data that are preprogrammed into the device during manufacture, data that are created by the device or added by the user, or any of a variety of types of information that are uploaded to, downloaded from, or otherwise accessed at servers or other devices with which the device is in communication during its ongoing operation.

The device 110 may include software and hardware networking components 180 to allow communications to and from the device. Such networking components 180 will typically provide wireless networking functionality, although wired networking may additionally or alternatively be supported.

In an embodiment, a power supply 190, such as a battery or fuel cell, may be included for providing power to the device 110 and its components. All or some of the internal components communicate with one another by way of one or more shared or dedicated internal communication links 195, such as an internal bus.

In an embodiment, the device 110 is programmed such that the processor 140 and memory 150 interact with the other components of the device 110 to perform a variety of functions. The processor 140 may include or implement various modules and execute programs for initiating different activities such as launching an application, transferring data, and toggling through various graphical user interface objects (e.g., toggling through various display icons that are linked to executable applications).

Figure 2:
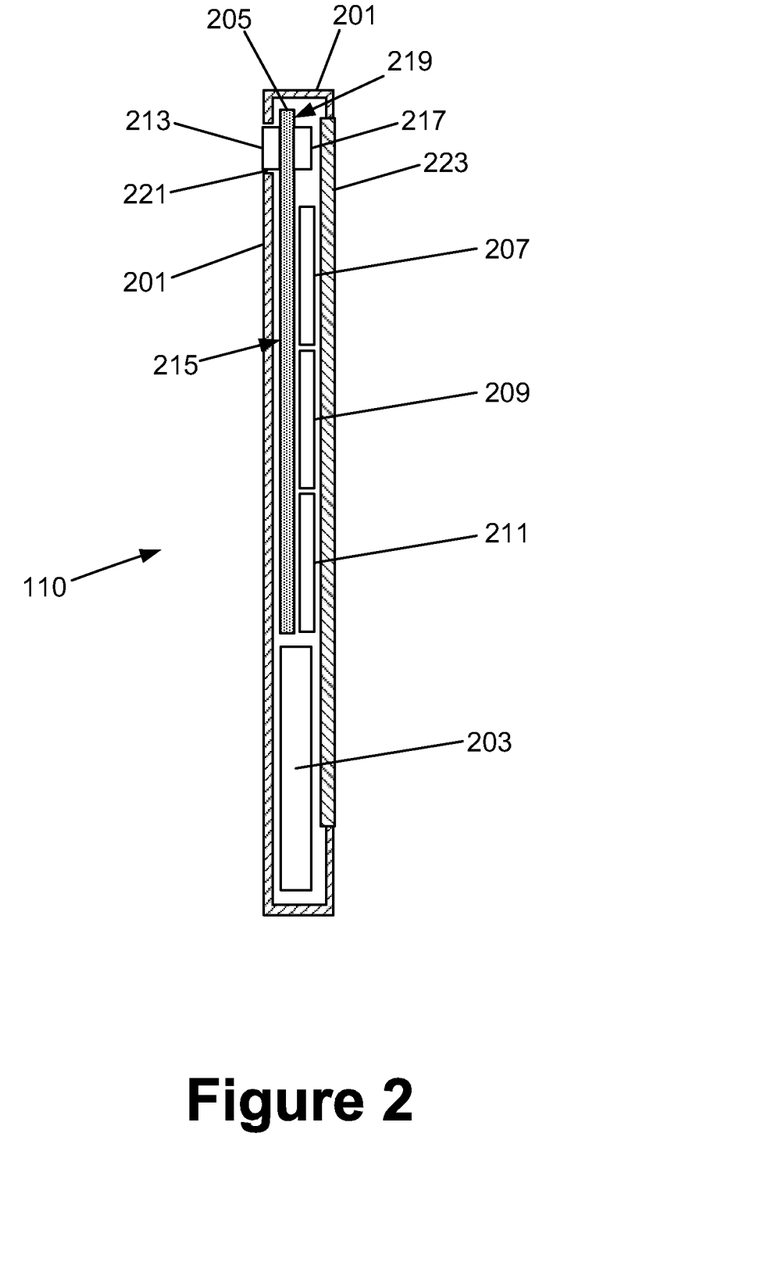
FIG. 2 is a simplified cross-sectional side view of a portable electronic device in accordance with an implementation of the disclosed principles.

Turning to FIG. 2, this figure presents a simplified side view schematic of a portable electronic device 110 in accordance with an implementation of the disclosed principles. In the illustrated example, the device 110 includes a housing 201, within which are located a battery 203 (e.g., power supply 190 of FIG. 1), as well as a PCB 205. As noted above, the PCB 205 is primarily single-sided with pads for a single test connector to be installed on the back side. The PCB 205 may host a number of circuit components such as a processor 207 (e.g., 140 of FIG. 1), and one or more memory ICs (e.g., 150 of FIG. 1) such as RAM 209 and/or ROM 211 ICs or circuits.

For RF testing and RF programming, the illustrated device 110 includes a test connection 213 on the back side 215 of the PCB 205, as well as a programming connection 217 on the front side 219 of the PCB 205. As noted above, the test connection 213 on the back side 215 of the PCB 205 and the hole 221 in the housing 201 are included on prototype devices for RF testing, but are not included on production devices.

As will be appreciated, in the illustrated configuration the programming connection 217 on the front side 219 of the PCB 205 is substantially inaccessible in an assembled device due to the screen 223 and other device components—thus, it cannot be used to perform any RF testing. However, the test connection 213 on the back side 215 of the PCB 205 allows the fully assembled device 110 to expose a test point.

Figure 3:
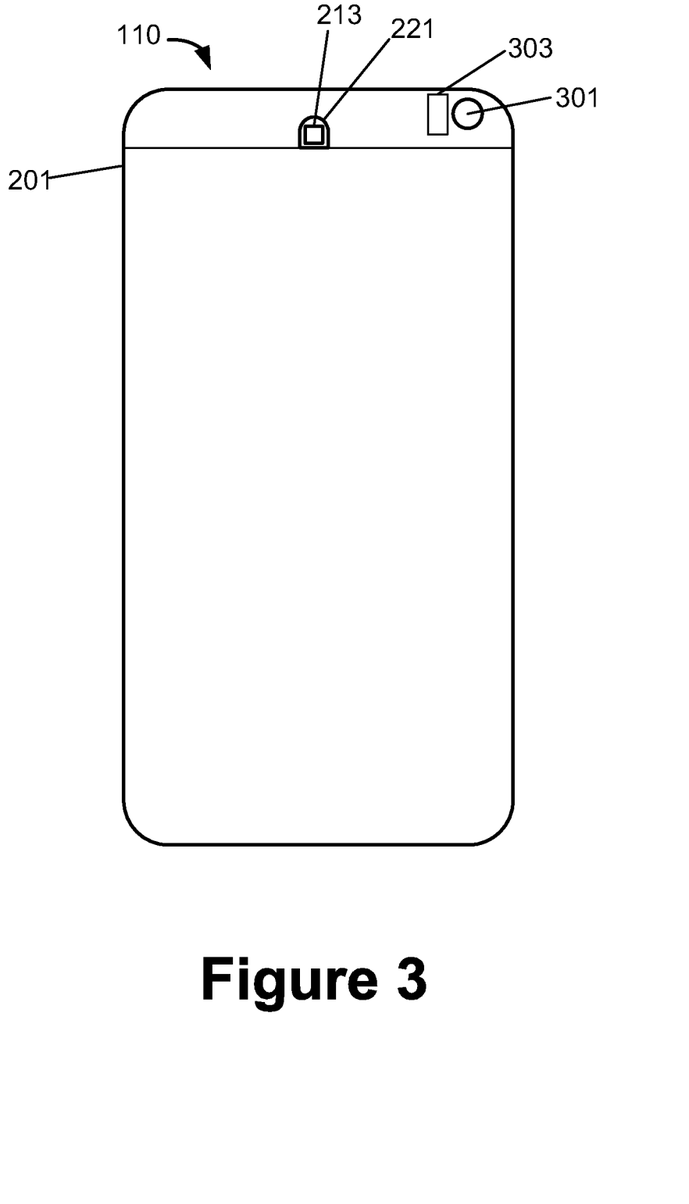
FIG. 3 is a back view of the portable electronic device of FIG. 2 within which embodiments of the disclosed principles may be implemented.

Continuing, FIG. 3 is a simplified back view of the portable electronic device 110 of FIG. 2. The device 110 includes, in this view, the housing 201 and the test connection 213. The hole 221 in the housing 201 not only allows access to the test connection 213 from outside the device 110, but also permits the very presence of the test connection 213 on the back side 215 of the device PCB 205 since the PCB 205 is against the housing 201.

Other optional components are shown in this view for context. In particular a rear-facing camera 301 and flash 303 are shown, but it will be appreciated that different, additional or alternative features may be provided on the rear of the device 110.

Figure 4:
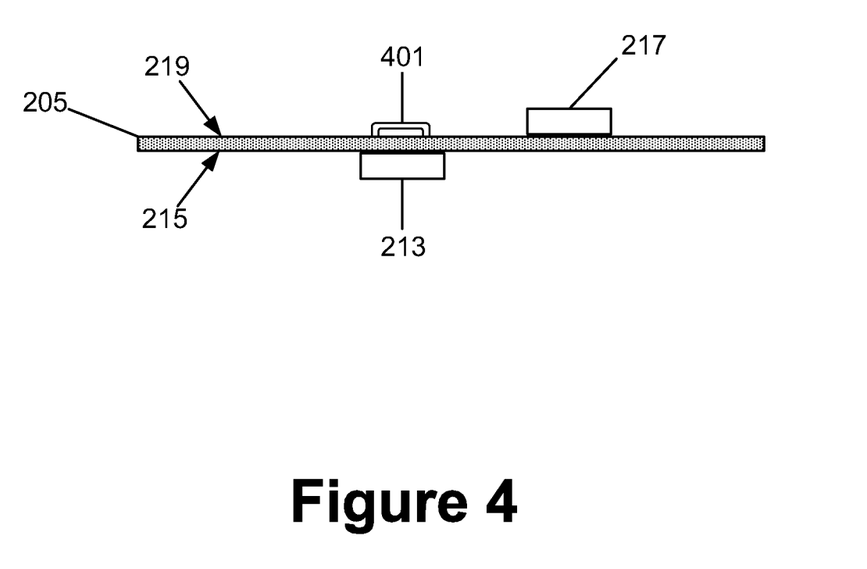
FIG. 4 is a simplified top view of a printed circuit board configured to illustrate the relative usable locations for a test connection, programming connection and shorting element in an embodiment of the disclosed principles.

It was noted in the overview above that a shorting element or zero ohm resistor is installed on the front side 219 of the PCB 205 when the test connection 213 is not installed on the back side 215 of the PCB 205. FIG. 4 is a top view of the PCB 205 showing an example spatial relationship between the various elements of the test and programming connection system.

The programming connection 217 can be seen on the front side 219 of the PCB 205, while the test connection 213 can be seen on the back side 215 of the PCB 205. In addition, the shorting element 401 is shown on the front side 219 of the PCB 205 in a position mirroring the position of the test connection 213 on the back side 215 of the PCB 205.

It will be appreciated that installation of the test connection 213 on the back side 215 of the PCB 205 and installation of the shorting element 401 on the front side 219 of the PCB 205 are mutually exclusive. That is, for a prototype device requiring testing, the test connection 213 is installed, whereas for a production device, the shorting element 401 is installed instead. In either case, the programming connection 217 is installed on the front side 219 of the PCB 205 as shown.

Figure 5:
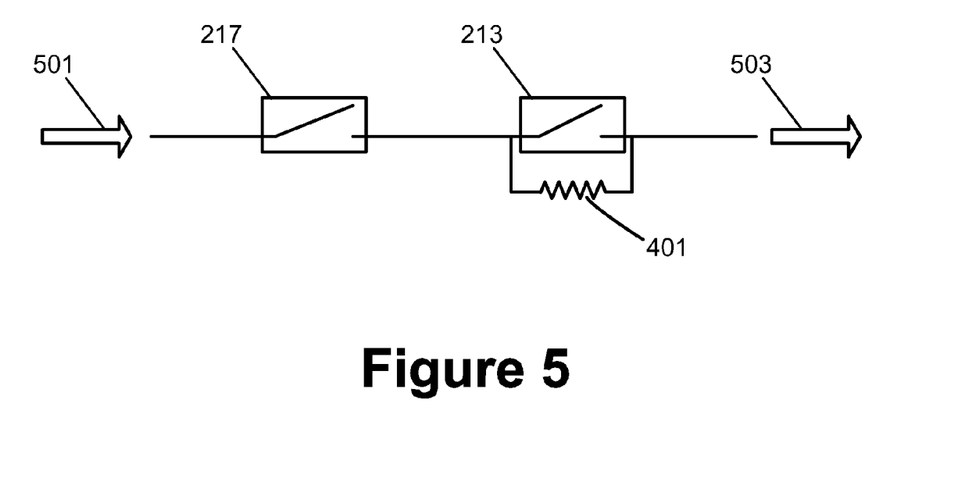
FIG. 5 is a circuit schematic showing relative electrical relationships between usable locations for a test connection, programming connection and shorting element in an embodiment of the disclosed principles.

In order to more fully explain the circuit functions and electrical relationships between the test connection 213, the shorting element 401 and the programming connection 217, FIG. 5 shows a circuit schematic of the configuration shown in FIG. 4, between an RF input 501 and an antenna output 503. As with FIG. 4, FIG. 5 shows both the test connection 213 and the shorting element 401 installed for illustration, but in practice, as noted above, the use of these two elements is mutually exclusive.

In the illustrated example, the test connection 213 and the shorting element 401 are configured and located in parallel with one another, meaning in this instance that the pads for each element provide alternative circuit paths between the same two points. The set of parallel elements 213, 410 is configured and located in series with programming connection 217, meaning in this instance that the test connection 213, if installed, and the shorting element 401, if installed, will be in series with the programming connection 217.

As noted above, in operation, the test connection 213 and the shorting element 401 are mutually exclusive. Operational scenarios involving these elements are shown in circuit form in FIGS. 6 and 7.

Figure 6:
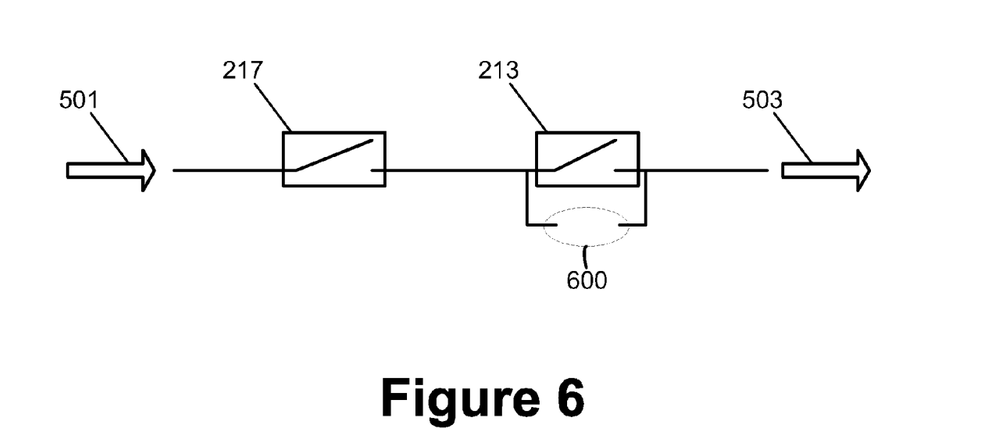
FIG. 6 is a circuit schematic showing relative electrical relationships between a test connection and a programming connection for a prototype device in accordance with an embodiment of the disclosed principles.

Turning to FIG. 6, this figure illustrates a prototype device configuration in which RF testing will be conducted. In this configuration, the test connection 213 is installed, but the shorting element 401 of FIGS. 4 and 5 is not installed. Without the shorting element 401 installed, the pads for receiving this element form an open circuit 600.

Figure 7:
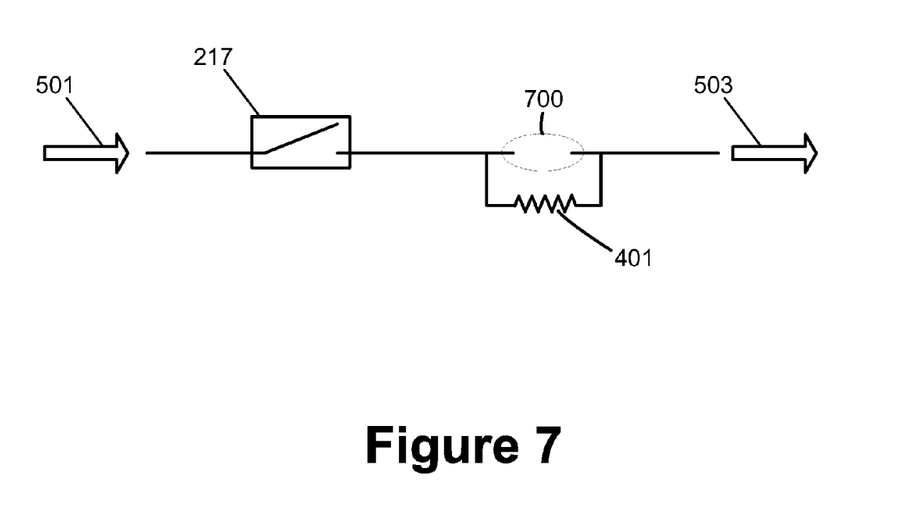
FIG. 7 is a circuit schematic showing relative electrical relationships between a shorting element and a programming connection for a production device in accordance with an embodiment of the disclosed principles.

FIG. 7 illustrates a production device configuration in which RF testing will not be conducted (having already been conducted at the prototype stage). In this configuration, the shorting element 401 is installed, but the test connection 213 is not. Without the test connection 213 installed, the pads for receiving the test connection 213 form an open circuit 700.

FIGS. 5-7 utilize the traditional symbol for a switch to denote the RF test connectors. In an embodiment, the RF test connectors are mechanical switches designed for use in an RF circuit. With no test probe attached to the connector, the switch is normally-closed. That is, the circuit is closed with no test probe attached to the RF test connector.

It will be appreciated that a system and method for allowing an RF test connection to be used in a prototype of compact portable electronic communication device have been disclosed herein. However, in view of the many possible embodiments to which the principles of the present disclosure may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A portable electronic device, the portable electronic device comprising:
    an antenna output configured to transmit and receive radio frequency (RF) signals;
    an RF input capable of sending an outgoing and receiving an incoming RF signal;
    a printed circuit board (PCB) hosting the RF input and a conductive circuit connecting the RF input to the antenna output, the conductive circuit being interrupted by first and second connection pad pairs connected in parallel with each other and then connected in series to a third connection pad pair; and
    a first RF connector placed across the third connection pad pair and one of a short placed across the first connection pad pair and a second RF connector placed across the second connection pad pair to close the interrupted circuit.

2. The portable electronic device in accordance with claim 1, wherein the short is a zero ohm resistor.

3. The portable electronic device in accordance with claim 1, wherein each RF connector is a normally-closed switch which opens only when a test probe is attached to the RF connector.

4. The portable electronic device in accordance with claim 1, wherein the PCB includes a primary side configured for placement of the numerical majority of electrical elements attached to the PCB and a secondary side opposite the primary side.

5. The portable electronic device in accordance with claim 4, wherein the first RF connector and the short are placed on the primary side of the PCB if the short is used and the second RF connector is placed on the secondary side of the PCB if the second RF connector is used.

6. The portable electronic device in accordance with claim 5, further comprising a housing having a user side exposing an electronic display and a back side opposite the user side, wherein the secondary side of the PCB is located adjacent an inner surface of the housing back side.

7. The portable electronic device in accordance with claim 6, wherein when the second RF connector is placed on the secondary side of the PCB, the housing includes an opening in the back side of the housing to expose the second RF connector.

8. The portable electronic device in accordance with claim 6, wherein when the short is placed on the primary side of the PCB, the housing is closed on the back side.

9. A method for making a portable electronic device having a printed circuit board that supports both radio frequency (RF) programming and RF testing on the same printed circuit board (PCB), the method comprising:
constructing a PCB configured to host an RF input, an antenna output and a conductive circuit connecting the RF input to the antenna output, the conductive circuit being interrupted by first and second connection pad pairs connected in parallel with each other and then connected in series to a third connection pad pair; and
placing a first RF connector across the third connection pad pair and placing one of a short across the first connection pad pair and a second RF connector across the second connection pad pair.

10. The method in accordance with claim 9, wherein placing a short across the first connection pad pair comprises placing a zero ohm resistor across the first connection pad pair.

11. The method in accordance with claim 9, wherein each RF connector is a normally-closed switch which opens only when a test probe is attached to the RF connector.

12. The method in accordance with claim 9, wherein the PCB includes a primary side and a secondary side opposite the primary side, the method further comprising affixing a numerical majority of PCB-mounted electrical elements of the portable electronic device on the primary side of the PCB.

13. The method in accordance with claim 12, further comprising affixing the first RF connector and the short on the primary side of the PCB if a short is used, and placing the second RF connector on the secondary side of the PCB if the second RF connector is used.

14. The method in accordance with claim 13, further comprising constructing a housing having a user side configured to expose an electronic display and a back side opposite the user side, the back side having an inner surface, wherein the secondary side of the PCB is located adjacent the inner surface of the housing back side.

15. The method in accordance with claim 14, wherein the housing includes an opening in the back side of the housing to expose the second RF connector when the second RF connector is used.

16. The method in accordance with claim 14, wherein the housing is closed on the back side when the short is used.

17. A printed circuit board (PCB) for a portable electronic device, the PCB comprising:
an RF input;
a conductive path leading from the RF input;
the conductive path being interrupted by first and second connection pad pairs connected in parallel with each other and then connected in series to a third connection pad pair; and a first RF connector placed across the third connection pad pair and one of a short placed across the first connection pad pair and a second RF connector placed across the second connection pad pair to close the interrupted conductive path.

18. The PCB in accordance with claim 17, wherein the PCB has a primary side configured for placement of the numerical majority of electrical elements to be attached to the PCB and a secondary side opposite the primary side, and wherein the first RF connector is affixed on the primary side of the PCB and the short, when used, is also affixed on the primary side of the PCB.

19. The PCB in accordance with claim 18, wherein the second RF connector, when used, is affixed on the secondary side of the PCB.

20. The PCB in accordance with claim 19, wherein each RF connector is a normally-closed switch which opens only when a test probe is attached to the RF connector.

* * * * *